US009470766B2

(12) United States Patent
Ross et al.

(10) Patent No.: US 9,470,766 B2
(45) Date of Patent: *Oct. 18, 2016

(54) MAGNETIC SENSOR (71) Applicant: NCR Corporation, Duluth, GA (US)

(72) Inventors: Gary Ross, Endinburg (GB); Adam Camilletti, Cambridge (GB); Andrew Nicholas Dames, Cambridge (GB); Edward G. Colby, Cambridge (GB)

(73) Assignee: NCR CORPORATION, Duluth, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/680,208

(22) Filed: Apr. 7, 2015

(65) Prior Publication Data

US 2015/0212167 A1 Jul. 30, 2015

Related U.S. Application Data (62) Division of application No. 12/976,699, filed on Dec. 22, 2010, now Pat. No. 9,000,759.

(51) Int. Cl.
*G01R 33/04* (2006.01)
*G01R 33/12* (2006.01)
*G06K 7/08* (2006.01)
*G07D 7/04* (2016.01)

(52) U.S. Cl.
CPC ............ *G01R 33/12* (2013.01); *G01R 33/04* (2013.01); *G06K 7/084* (2013.01); *G07D 7/04* (2013.01)

(58) Field of Classification Search
CPC .................................................... G01R 33/04
USPC .................................................. 324/228, 232
See application file for complete search history.

(56) References Cited

U.S. PATENT DOCUMENTS

| 5,196,681 | A  | * | 3/1993  | Mantegazza ............. 235/449 |
| 9,000,759 | B2 | * | 4/2015  | Ross et al. ............... 324/228 |
| 2005/0172480 | A1 | * | 8/2005  | Choi et al. ................. 29/607 |
| 2007/0011919 | A1 | * | 1/2007  | Case ..................... A43B 1/0036 36/132 |
| 2007/0241201 | A1 | * | 10/2007 | Brown ................. G06Q 20/26 235/493 |
| 2007/0295089 | A1 | * | 12/2007 | Velinsky et al. ......... 73/514.01 |

OTHER PUBLICATIONS

"U.S. Appl. No. 12/976,699, Non Final Office Action mailed Apr. 26, 2013", 7 pgs.
"U.S. Appl. No. 12/976,699, Non Final Office Action mailed Nov. 7, 2013", 7 pgs.
"U.S. Appl. No. 12/976,699, Response filed Apr. 7, 2014 to Non Final Office Action mailed Nov. 7, 2013", 7 pgs.
"U.S. Appl. No. 12/976,699, Response filed Apr. 9, 2013 to Restriction Requirement mailed Mar. 29, 2013", 1 pg.
"U.S. Appl. No. 12/976,699, Response filed Jul. 25, 2013 to Non Final Office Action mailed Apr. 26, 2013", 8 pgs.
"U.S. Appl. No. 12/976,699, Restriction Requirement mailed Mar. 29, 2013", 6 pgs.

* cited by examiner

*Primary Examiner* — Reena Aurora
(74) *Attorney, Agent, or Firm* — Schwegman, Lundberg & Woessner (57) ABSTRACT A magnetic sensor for discriminating between high and low coercivity magnets is disclosed. The sensor comprises a first magnetic field operable to orient high and low coercivity magnets in a first magnetic orientation. The sensor also comprises a second magnetic field, lower in strength than the first magnetic field, and operable to orient only the low coercivity magnets in a second magnetic orientation opposite to the first magnetic orientation. The sensor further comprises a sensor for ascertaining the magnetic orientation of each of the magnets and thereby identifying if a magnet is a high coercivity magnet or a low coercivity magnet.

9 Claims, 6 Drawing Sheets

MAGNETIC SENSOR

RELATED APPLICATIONS

The present invention claims priority to and is a divisional of U.S. Ser. No. 12/976,699, filed on Dec. 22, 2010 entitled "Magnetic Sensor," which issued on Apr. 7, 2015 as U.S. Pat. No. 9,000,759; the disclosure of which is incorporated by reference herein in its entirety.

FIELD OF INVENTION

The present invention relates to improvements in or relating to a magnetic sensor.

BACKGROUND OF INVENTION

Magnetic sensors are used in many different applications. One important application is for validating banknotes. A banknote typically contains one or more covert security features to enable the authenticity of the banknote to be validated.

One type of covert security feature is magnetic printing on a banknote; another type of covert security feature involves embedding magnetic features into a banknote. For either of these security features, it is important to be able to detect the magnetic properties of that security feature.

In addition to providing basic magnetic printing, some covert security features incorporate a mixture of high coercivity and low coercivity magnets. As is known to those of skill in the art, the coercivity of a magnet represents the intensity of applied magnetic field needed to reduce the magnetization of that magnet from saturation to zero. High coercivity requires a strong magnetic field to be present to reduce the magnetization to zero; whereas, low coercivity only requires a weak magnetic field to be present to reduce the magnetization to zero.

It is known to use magnetoresistive (MR) sensors to detect magnetic security features, but MR sensors only detect a change in magnetic field strength, such as a transition from a magnetic material to a non-magnetic material, and vice versa. They do not detect the strength of a magnetic field, per se.

Furthermore, MR sensors are not very effective at distinguishing between high coercivity magnets and low coercivity magnets, so any security feature comprising a spatial arrangement of high coercivity and low coercivity magnets may not be reliably authenticated using an MR sensor. This lack of reliable authentication reduces the usefulness of MR sensors at detecting counterfeit banknotes.

It would be desirable to provide a magnetic sensor that can distinguish between high coercivity and low coercivity magnets, and that can also sense the field strength of a magnet, not just the transition between a magnetic material and a non-magnetic material.

SUMMARY OF INVENTION

Accordingly, the invention generally provides methods, systems, apparatus, and software for sensing a series of magnets and ascertaining if each magnet is high coercivity or low coercivity by applying a strong magnetic field of one polarity to the series of magnets, then applying a weak magnetic field of an opposite polarity to the series of magnets, then ascertaining the polarity of each of the magnets in the series of magnets.

By applying a strong field first, all of the magnets in the series (high coercivity and low coercivity) will be oriented to that magnetic field. Applying a weak field to all of the magnets will then only flip the orientation of the low coercivity magnets, not the high coercivity magnets. Those magnets that have the flipped magnetic field are low coercivity magnets, those that have not flipped are high coercivity magnets.

In addition to the Summary of Invention provided above and the subject matter disclosed below in the Detailed Description, the following paragraphs of this section are intended to provide further basis for alternative claim language for possible use during prosecution of this application, if required. If this application is granted, some aspects may relate to claims added during prosecution of this application, other aspects may relate to claims deleted during prosecution, other aspects may relate to subject matter never claimed. Furthermore, the various aspects detailed hereinafter are independent of each other, except where stated otherwise. Any claim corresponding to one aspect should not be construed as incorporating any element or feature of the other aspects unless explicitly stated in that claim.

According to a first aspect there is provided a magnetic sensor for discriminating between high and low coercivity magnets, the sensor comprising: (i) a first magnetic field operable to orient high and low coercivity magnets in a first magnetic orientation; (ii) a second magnetic field, lower in strength than the first magnetic field, and operable to orient only the low coercivity magnets in a second magnetic orientation opposite to the first magnetic orientation; and (iii) a sensor for ascertaining the magnetic orientation of each of the magnets and thereby identifying if a magnet is a high coercivity magnet or a low coercivity magnet.

The sensor for ascertaining the magnetic orientation of each of the magnets may comprise a fluxgate sensor, a magnetoresistive sensor, or any other convenient magnetic sensor.

As is known to those of skill in the art, a fluxgate sensor is a device that measures the intensity and orientation of magnetic lines of flux. Fluxgate sensors are typically cores of a highly magnetically permeable alloy around which are wrapped two coil windings: a drive winding and a sense winding. Alternating current (AC) is passed through the drive winding producing an alternating magnetic field that induces AC in the sense winding. The intensity and phase of the AC in the sense winding are constantly measured. When a change occurs in the external magnetic field, the output of the sense winding changes. The extent and phase of this change can be analyzed to ascertain the intensity and orientation of the magnetic flux lines. The sense winding signal will be twice the frequency of the drive winding because it appears on both its positive and negative half cycles.

Fluxgate sensors are also described in detail in U.S. Pat. No. 4,646,015 entitled "Flux gate sensor with improved sense winding gating".

Low coercivity may be considered as any coercivity below approximately 50 KA/m (approximately 628 oersted); whereas, high coercivity may be considered as any coercivity equal to or above approximately 50 KA/m.

The fluxgate sensor may comprise a printed circuit board (pcb) having a plurality of track layers.

The pcb may also define a plurality of vias extending therethrough, and a plurality of tracks, each track spiraling around a via to provide a coil. By spiraling a track on one layer, a planar coil is provided. As used herein, the word "spiral" is used in a broad sense, covering both a continuously-curved line (having a diminishing local radius along its length) and straight line portions (of diminishing length) connected by corners.

The fluxgate sensor may also comprise a plurality of microwires, each microwire located in a via and oriented normal to the pcb track layers. The microwires may comprise glass coated bistable microwire. Each microwire may have a diameter of less than fifty microns.

One advantage of using glass coated microwire is that these microwires exhibit instantaneous domain flip, in contrast to conventional iron or steel cores, which typically exhibit a sequential domain flip.

The fluxgate sensor may comprise a linear array of vias (such as thirty-two vias), and adjacent vias may be separated by a fixed distance (such as a few millimeters). By arranging the fluxgate sensor as a linear array, it is possible to mount the fluxgate sensor on a media validator, such as a banknote validator, with the linear array perpendicular to a transport direction. This ensures that as a banknote is transported beneath the linear array, the linear array covers either the entire width, or a large proportion of the width, of the banknote. Any magnetic features in the banknote would be detected by the fluxgate sensor as the banknote is transported across the fluxgate sensor.

The magnetic sensor may further comprise (iv) a second fluxgate sensor spaced from and aligned with the first fluxgate sensor to define a gap between the two fluxgate sensors through which media items may be moved. Using two fluxgate sensors mounted in opposing relation reduces the effects of noise.

According to a second aspect there is provided a media depository comprising:

a media validator for recognizing and validating media items;

a transport arranged to convey a media item from an input to the media validator; and a magnetic sensor incorporated within the media validator and operable for discriminating between high and low coercivity magnets, the sensor further comprising: (i) a first magnetic field operable to orient high and low coercivity magnets in a first magnetic orientation; (ii) a second magnetic field, lower in strength than the first magnetic field, and operable to orient only the low coercivity magnets in a second magnetic orientation opposite to the first magnetic orientation; and (iii) a sensor for ascertaining the magnetic orientation of each of the magnets and thereby identifying if a magnet is a high coercivity magnet or a low coercivity magnet.

The sensor for ascertaining the magnetic orientation of each of the magnets may comprise a fluxgate sensor, a magnetoresistive sensor, or any other convenient magnetic sensor.

The media depository may comprise a banknote validator. The media depository may also dispense media that was previously deposited therein (referred to as a media recycler). The media depository may be installed in an automated teller machine (ATM).

The media validator may include a first imager for imaging a first side of a banknote, and optionally a second imager for imaging a second side (opposite the first side) of the banknote.

The media validator may include a template incorporating magnetic feature information, including magnetic features exhibiting high coercivity and magnetic features exhibiting low coercivity.

According to a third aspect there is provided a method of discriminating between high and low coercivity magnets, the method comprising:

using a first magnetic field to orient high and low coercivity magnets in a first magnetic orientation;

using a second magnetic field lower in strength than the first magnetic field to orient only the low coercivity magnets in a second magnetic orientation opposite to the first magnetic orientation;

ascertaining the magnetic orientation of each of the magnets; and identifying if a magnet is a high coercivity magnet or a low coercivity magnet based on the ascertained magnetic orientation.

The magnets may be located on a banknote.

According to a fourth aspect there is provided a method of validating a banknote including magnetic security features, the method comprising:

transporting the banknote to a magnetic sensor according to the first aspect;

detecting magnetic features along a strip of the banknote adjacent to the magnetic sensor;

classifying each detected magnetic feature as either high coercivity or low coercivity;

repeating the transporting, detecting, and classifying steps until the banknote has been transported beyond the magnetic sensor;

creating a spatial representation of high coercivity and low coercivity magnetic features on the banknote based on the classifying steps; and validating the banknote by comparing data from the created spatial representation with a predefined template for an authentic banknote.

The step of validating the banknote may include using any convenient two-dimensional correlation technique.

According to a fifth aspect there is provided a media validator comprising a fluxgate sensor.

For clarity and simplicity of description, not all combinations of elements provided in the aspects recited above have been set forth expressly. Notwithstanding this, the skilled person will directly and unambiguously recognize that unless it is not technically possible, or it is explicitly stated to the contrary, the consistory clauses referring to one aspect are intended to apply mutatis mutandis as optional features of every other aspect to which those consistory clauses could possibly relate.

These and other aspects will be apparent from the following specific description, given by way of example, with reference to the accompanying drawings.

BRIEF DESCRIPTION OF THE DRAWINGS

FIG. 6 a graph illustrating the output of part (an individual channel detector) of the magnetic sensor of FIG. 2 as an array of magnetic security features (in the form of a metallic strip) from a media item (a banknote) passes by.

DETAILED DESCRIPTION

Figure 1:
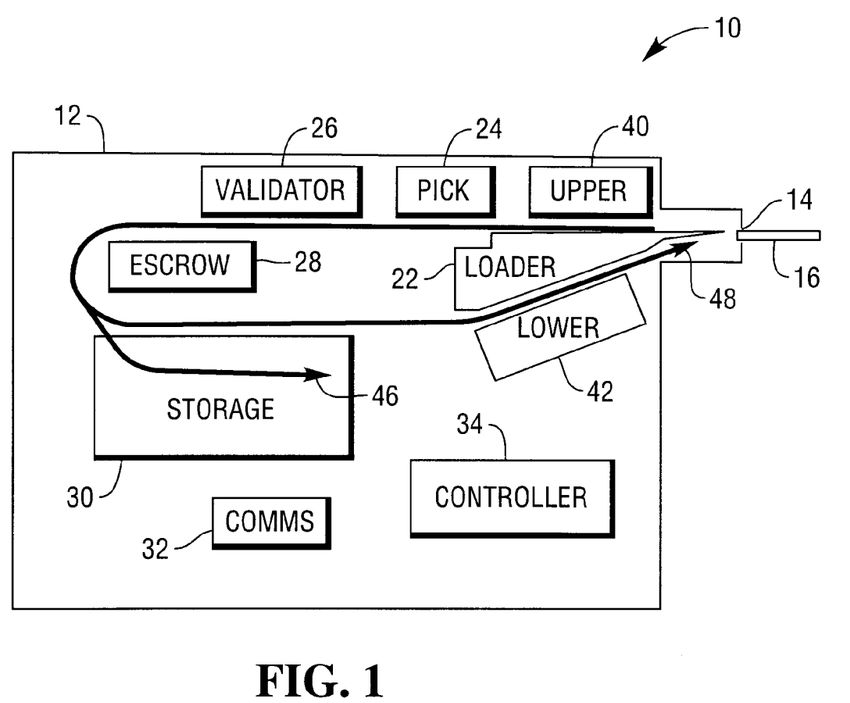
FIG. 1 is a simplified schematic diagram of a media depository according to one embodiment of the present invention, where the media depository includes a media validator that incorporates a magnetic sensor.

Reference will now be made to FIG. 1, which is a simplified schematic diagram of a media depository 10 according to one embodiment of the present invention. The depository 10 is operable to receive bunches of banknotes from a customer.

The depository 10 includes a chassis 12 in which various other components of the depository 10 are mounted.

The depository 10 further comprises: a bunch deposit slot 14 into which a bunch of banknotes 16 can be deposited; a bunch loader 22; a picker 24 aligned with the bunch loader 22 for removing individual banknotes from the bunch (or stack) of banknotes 16; a media validator 26 for validating individual banknotes 16; an escrow 28 for temporarily holding validated banknotes until a customer confirms that he/she wants to complete the transaction; a storage compartment 30 for storing banknotes 16 once the customer has confirmed that he/she desires to complete the transaction; a communications circuit board 32 for communicating with a self-service terminal (not shown) into which the depository 10 may be installed; and an onboard controller 34 for controlling the operation of the depository 10.

The depository 10 includes a plurality of banknote transport sections, only some of which will be described herein. An upper banknote transport section 40 is located above the bunch loader 22 and adjacent the picker 24. A lower banknote transport section 42 is located beneath the bunch loader 22 and near the bunch deposit slot 14.

The bunch loader 22 is used to transport deposited banknotes 16 from the bunch deposit slot 14 to the picker 24.

There are two different routes that can be taken by a banknote that is inserted into the depository 10. The first route is shown by arrow 46 and involves the banknote being picked from the bunch of banknotes 16, transported to the picker 24, moved past the validator 26 to be identified and validated, placed in the escrow 28, and from the escrow 28 transported into the storage compartment 30.

The second route is shown by arrow 48 and involves the banknote being picked from the bunch of banknotes 16, transported to the picker 24, moved past the validator 26 to be identified and validated, placed in the escrow 28, and from the escrow 28 returned to the customer via the lower sheet transporter 42.

The onboard controller 34 controls the various transport sections (described above) within the depository 10 for moving banknotes 16 between different parts of the depository 10.

As is known in the art, whether a banknote is stored (that is, follows the first route 46 in this embodiment) or returned to the customer (that is, the second route 48 in this embodiment) depends on a number of factors, such as: whether the banknote is recognized, whether the banknote is validated, whether the customer cancels or confirms the transaction, and the like.

In this embodiment, part of the banknote validation process involves validating that a banknote being examined by the media validator 26 includes the correct magnetic features for that banknote.

Figure 2:
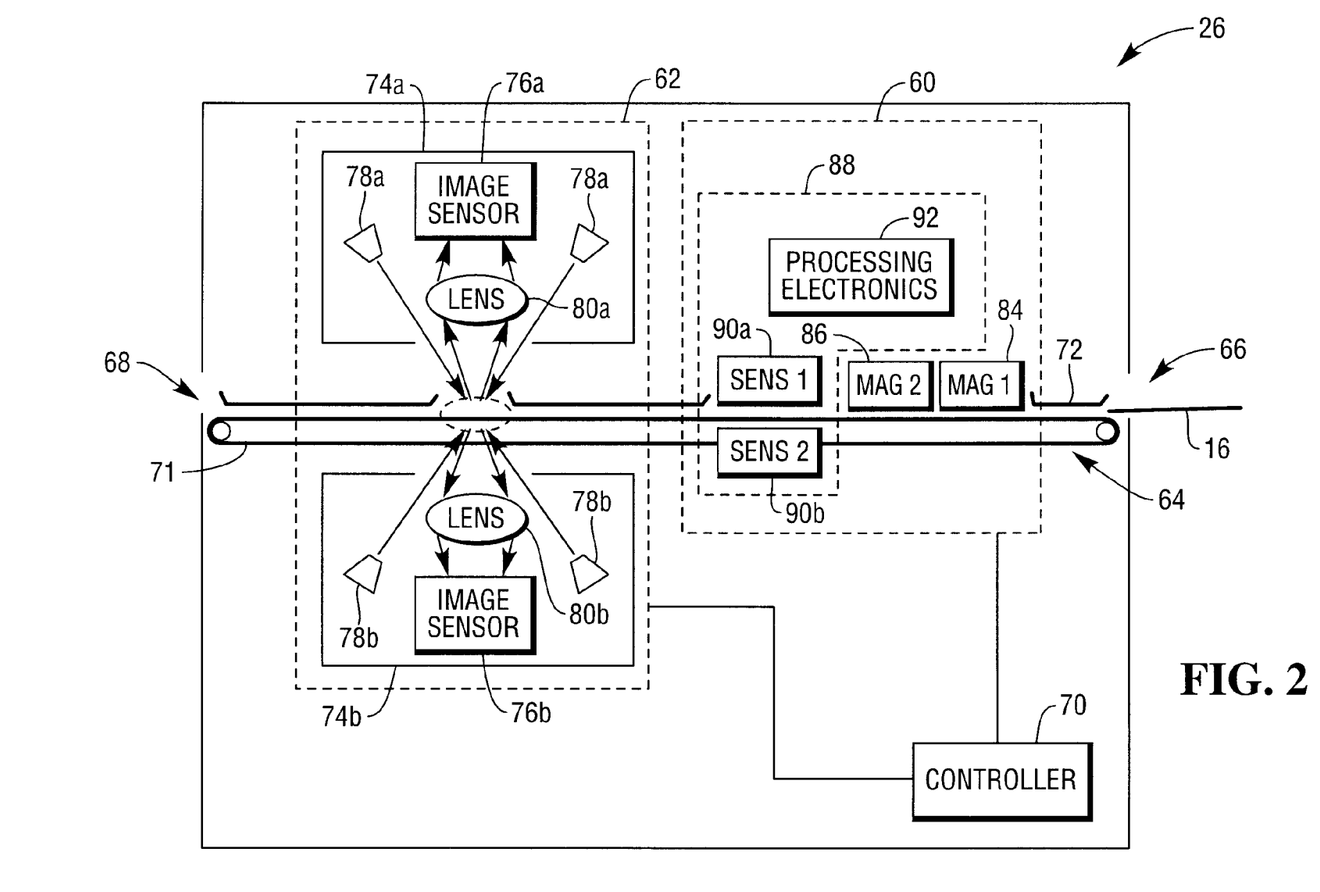
FIG. 2 is a simplified schematic diagram of the media validator of FIG. 1, illustrating the magnetic sensor in more detail.

Reference will now be made to FIG. 2, which is a simplified schematic diagram of the media validator 26, illustrating parts thereof.

The media validator 26 comprises: a magnetic sensor 60, an optical sensor 62, a transport section 64 extending over the length of the media validator 26 from a validator entrance 66 to a validator exit 68, and a validation controller 70 coupled to both the magnetic sensor 60 and the optical sensor 62 and operable to control the transport section 64.

In this embodiment, the transport section 64 comprises a combination of stretchable endless belts 71 and plastic skid plates 72, but any convenient transport arrangement (such as, rollers, belts, skid plates, or any combination of these) could be used.

The optical sensor 62 is conventional and includes an upper imager 74a and a lower imager 74b mounted on opposite sides of the transport section 64. The imagers 74 are identical, and each imager 74a,b includes an image sensor 76a,b, illumination sources (in the form of light emitting diodes) 78a,b for illuminating each side (front and back) of a banknote as it is transported past the image sensors 76a,b, and a lens 80a,b for focusing reflected light from the banknote onto the respective image sensor 76a,b.

The validation controller 70 includes algorithms for recognizing banknotes and validating the banknotes. Any convenient algorithms could be used, but this embodiment uses algorithms based on those disclosed in PCT application number PCT/GB2006/004676 (publication number WO/2007/068930) assigned to NCR Corporation.

The magnetic sensor 60 comprises: a first permanent magnet 84 located above the transport section 64; a second permanent magnet 86 also located above the transport section 64; and a fluxgate sensor 88.

It should be appreciated that the first permanent magnet 84 is located nearer the validator entrance 66 than the second permanent magnet 86. This is so that a banknote 16 passes the first permanent magnet 84 before passing the second permanent magnet 86.

In this embodiment, the first permanent magnet 84 generates a magnetic field of approximately 300 k $Atm^{-1}$ (Ampere turns per meter), and is aligned with its north pole towards the transport section 64, and consequently towards any banknote transported therealong.

The magnetic strength value of the first permanent magnet 84 is selected so that all magnetic features in a banknote 16 will be oriented with the first permanent magnet 84 (that is, with the north polarity), regardless of whether the magnetic features exhibit high coercivity or low coercivity properties.

In this embodiment, the second permanent magnet 86 generates a significantly lower magnetic field than the first permanent magnet 84. The second permanent magnet 86 generates a field of approximately 120 k $Atm^{-1}$ (Ampere turns per meter), and is aligned with its south pole towards the transport section 64, and consequently towards any banknote transported therealong.

The magnetic strength value of the second permanent magnet 86 is selected so that only those magnetic features in a banknote 16 exhibiting low coercivity will be oriented with the second permanent magnet 86 (that is, with the south polarity). Any magnetic features in a banknote 16 exhibiting high coercivity will remain oriented with the first permanent magnet 84 (that is, with the north polarity).

The fluxgate sensor 88 comprises: an upper sensing board 90a located above the transport section 64; a lower sensing board 90b located below the transport section 64 opposite the upper sensing board 90a, and processing electronics 92 coupled to both of the sensing boards 90.

The upper and lower sensing boards 90a,b are also identical. The reason that two sensing boards 90a,b are used is that combination of the two sensing boards 90 cancels out much of the noise produced by each sensing board 90 on its own, thereby providing a cleaner signal.

Figure 3:
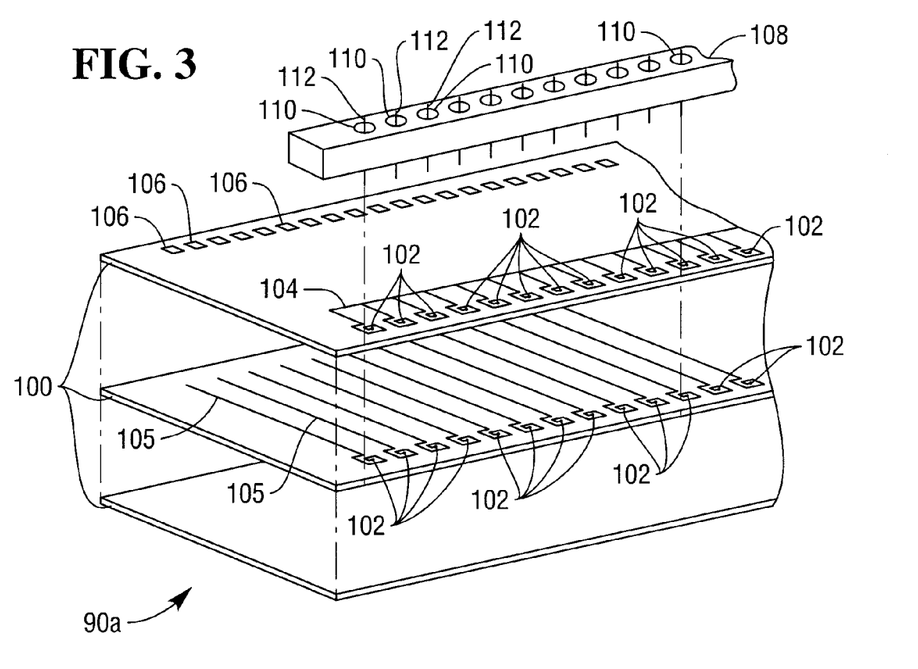
FIG. 3 is a simplified schematic diagram illustrating a portion of the magnetic sensor of FIG. 2 in more detail.

One of the sensing boards 90 will now be described in more detail, with reference to FIG. 3, which is a simplified schematic diagram illustrating part of one of the sensing boards 90a in more detail, with parts thereof shown exploded for clarity.

The sensing board 90a comprises a six layer printed circuit board (pcb) 100. The pcb 100 defines a plurality of vias 102 disposed in a linear array. In this embodiment, the linear array comprises thirty-two vias 102 (for clarity, only some of which are shown) arranged in a straight line along the pcb 100 with a spacing of approximately two millimeters between via centres.

The pcb 100 includes a first (excitation) planar coil track 104 on the first (top) layer of the pcb 100, where the excitation track 104 loops around each via 102. This planar coil track 104 is used as an excitation coil. The loops around each via 102 are all connected in parallel, so that when the excitation track 104 is energized, all of the loops are energized.

The pcb 100 also includes a set of sensing planar coil tracks 105 on a different layer (in this example the third layer) of the pcb 100, where the sensing tracks 105 also loop around each via 102.

Each of the sensing tracks 105 is similar to, but vertically displaced from, the excitation track 104. There is one main difference between the excitation track 104 and the sensing tracks 105. All of the loops around the vias 102 (referred to as via loops) for the excitation track 104 are mutually connected; whereas, each of the via loops for the sensing tracks 105 is isolated from all of the other via loops so that the current induced in each via loop can be measured separately. Each via loop from the sensing tracks 105 is coupled to a connector 106 mounted on the first layer of the pcb 100.

The sensing board 90a further comprises a plastic wire holder 108 mounted to and extending along the pcb 100. The plastic wire holder 108 defines thirty-two apertures 110 in registration with the vias 102, each aperture 110 retaining a glass coated bistable microwire 112 which extends through its associated via 102 perpendicular to the layers of the pcb 100.

Each via 102 and microwire 112 forms a fluxgate sensing component when the excitation track 104 is excited. The sensing board 90a thus provides an array of thirty-two fluxgate sensing components.

As mentioned above, the two sensing boards 90 are located opposite each other, so that the first fluxgate sensing component on sensing board 90a is aligned with the first fluxgate sensing component on sensing board 90b.

Figure 4:
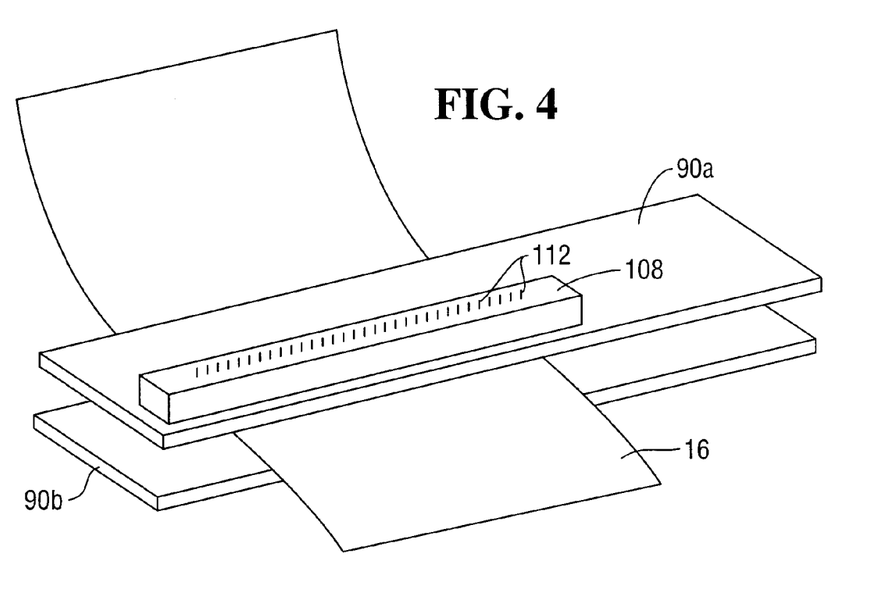
FIG. 4 is a simplified schematic diagram illustrating a media item passing between portions of the magnetic sensor of FIG. 2.

The sensing boards 90a,b are oriented normal to the transport direction, so that as a banknote 16 is transported along the transport section 64, the thirty-two fluxgate sensing components extend along the width of the banknote 16, thereby covering most of the banknote width, as illustrated in FIG. 4, which is a simplified schematic diagram illustrating a banknote 16 passing between the sensing boards 90a,b.

The processing electronics 92 will now be described with reference to FIG. 5, which is an electrical schematic diagram.

Figure 5A:
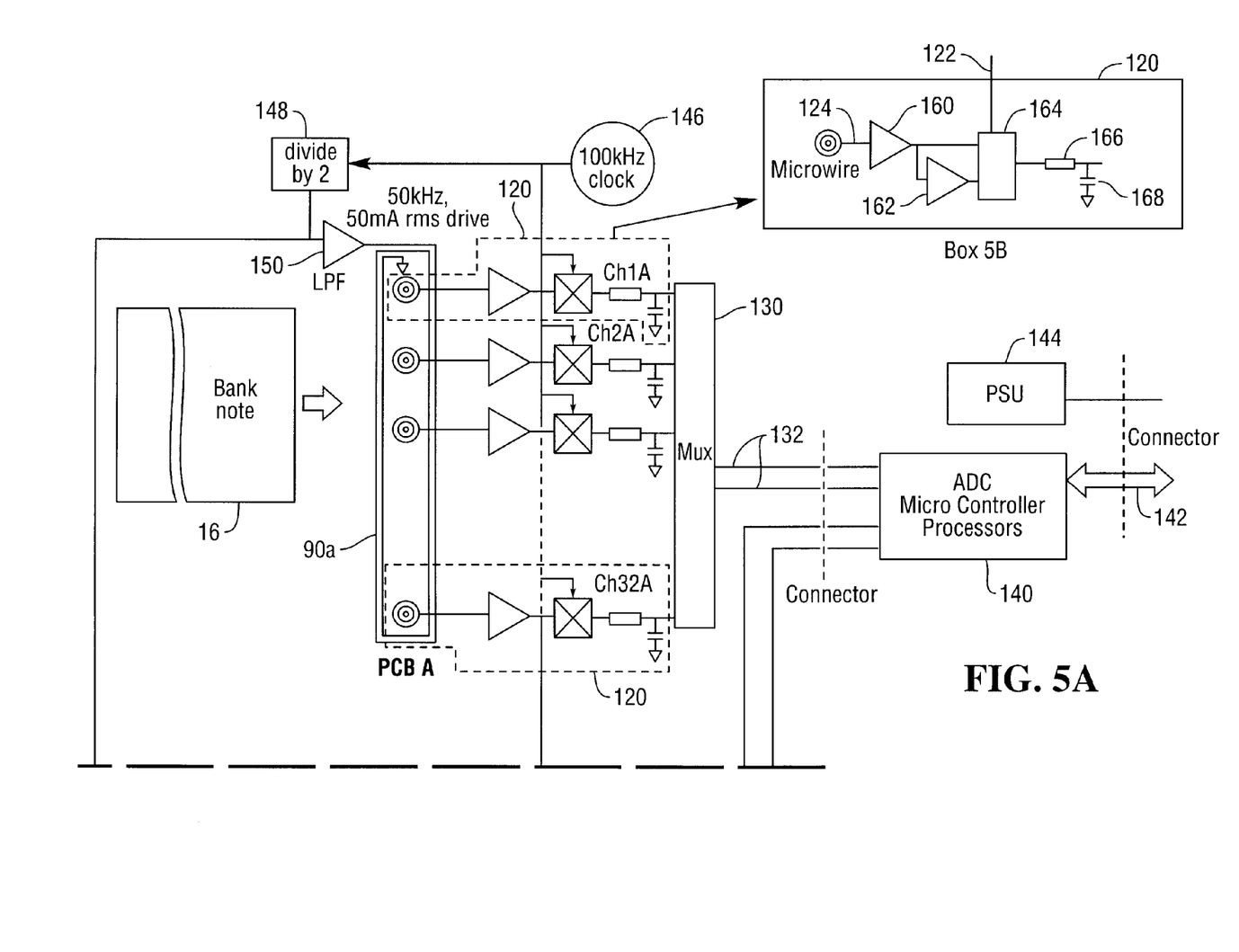
FIG. 5 is an electrical schematic diagram (split across 5A and 5B for clarity) illustrating another part (processing electronics) of the magnetic sensor of FIG. 2.
Figure 5B:
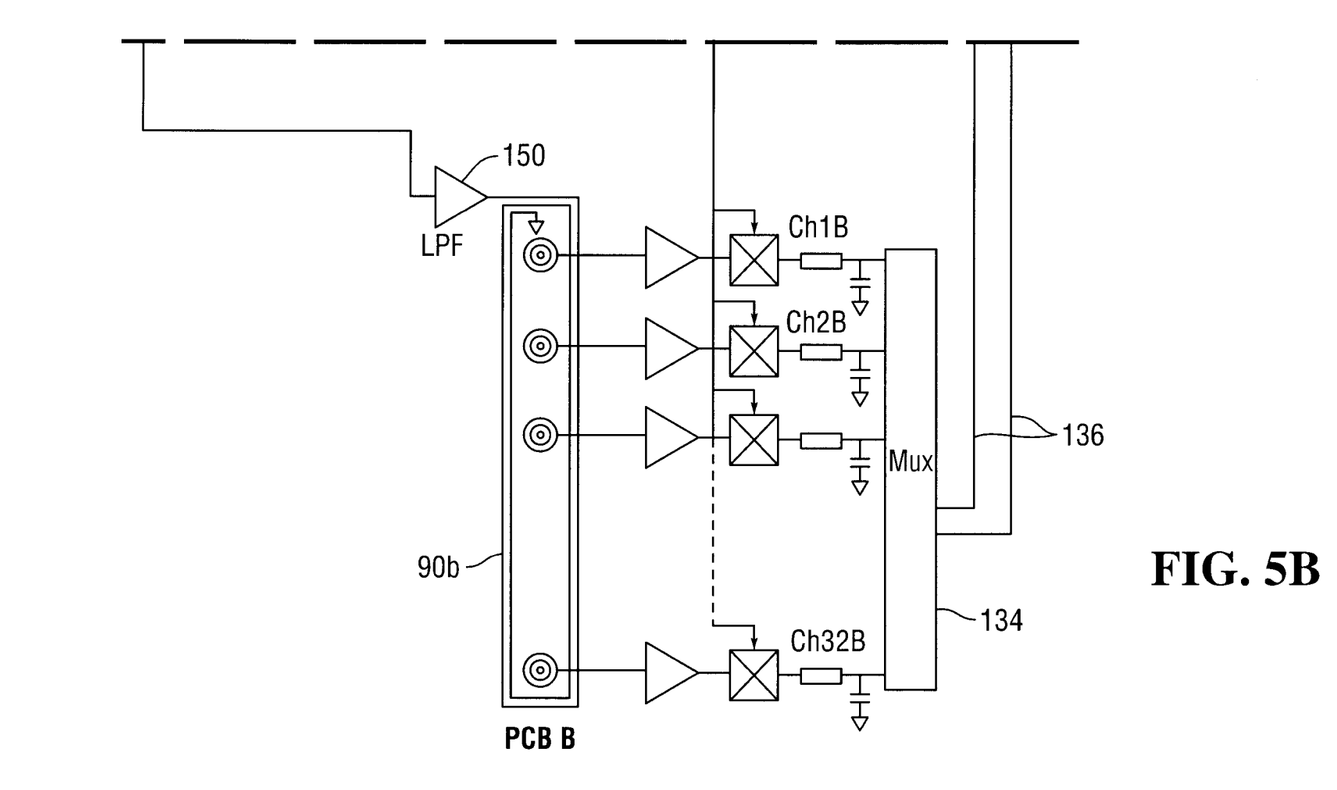

The processing electronics 92 includes thirty-two individual channel detectors 120 (shown in detail in inlay box 5B) for sensing board 90a and another thirty-two channel individual channel detectors 120 for sensing board 90b. The sixty-four channel detectors 120 are all identical, so only one is shown in detail.

Each individual channel detector 120 comprises a timing input 122 and a sensing input 124 and generates a sensing output 126.

The thirty-two individual channel detectors 120 for sensing board 90a are input to a first multiplexer 130 having a pair of sensing outputs 132; whereas, the thirty-two individual channel detectors 120 for sensing board 90b are input to a second multiplexer 134, also having a pair of sensing outputs 136.

The two pairs of sensing outputs 132,136 are input to a microcontroller 140, which includes an analogue to digital converter and digital processing circuitry. The microcontroller 140 provides an output 142 which is fed into the validation controller 70 (FIG. 2). The microcontroller 140 buffers the received data and outputs the data on the microcontroller output 142.

The processing electronics 92 also includes a power supply unit 144, a signal generator 146 (including a 100 kHz clock), and a divide-by-two circuit 148.

The signal generator 146 outputs a 50 mA root mean square alternating current at 100 kHz. This is fed directly into the timing input 122 of each individual channel detector 120.

The signal generator output is also fed into the divide-by-two circuit 148 to create a 50 kHz 50 mA r.m.s. alternating current. This divide-by-two output is then fed through a low pass filter (LPF) 150 and from there into the excitation track 104 for each of the sensing boards 90a,b.

When a magnet is brought near to one of the individual channel detectors 120, the sensing track 105 for that individual channel detector 120 detects the magnet and generates a current, which is detected on the sensing input 124 of that individual channel detector 120. This occurs twice in each cycle, once for positive current, the other for negative current.

The individual channel detector 120 comprises a pre-amplifier 160, an inverting amplifier 162, a switch 164, a series resistor 166, and a capacitor 168. The timing input 122 is fed into a clock in the switch 164. Since the signal on the timing input 122 is double the frequency of the signal on excitation current, the signal on the sensing input 124 (which is double the frequency of the excitation current) will be the same frequency as the timing input 122. Thus, a positive signal will be routed through the pre-amplifier 160 by the switch 164, and a negative signal will be routed through the inverting amplifier 162 by the switch 164.

The multiplexers 130,134 are in phase, so the signal from the first channel of the first multiplexer 130 is sent to the microcontroller 140 at the same time as the signal from the second multiplexer 134. The microcontroller 140 then subtracts these signals, thereby reducing the effects of noise.

The output of the microcontroller 140 gives an indication of the magnetic field strength and polarity sensed by each of the thirty-two individual channel detectors 120.

Figure 6:
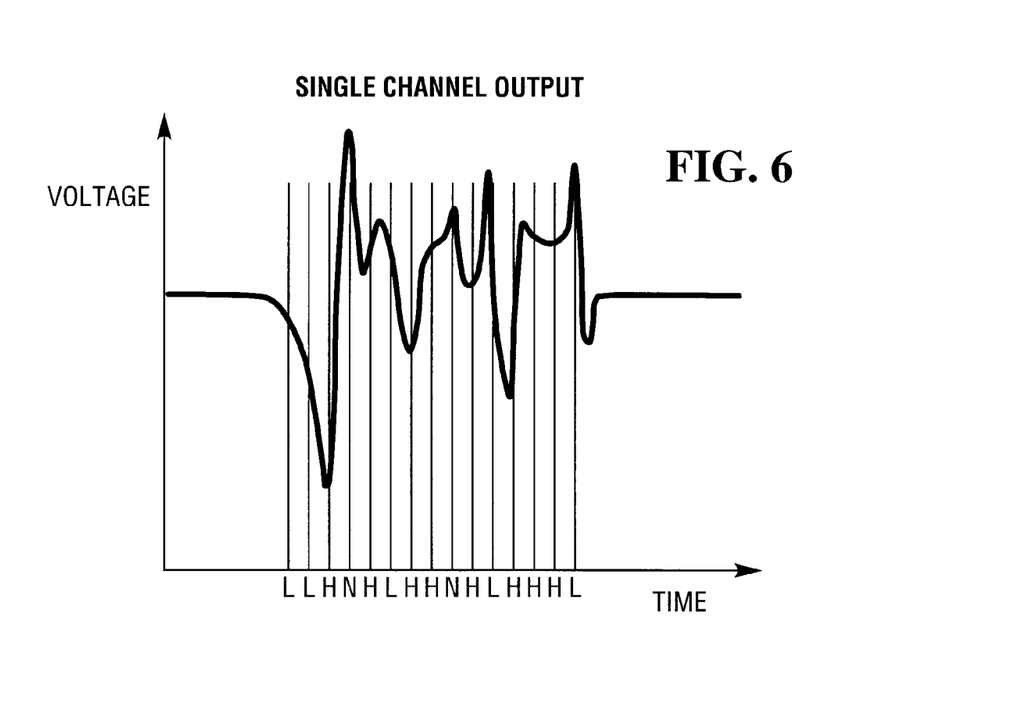

Reference will now be made to FIG. 6, which is a graph illustrating the output (in analogue form) of one of the individual channel detectors 120 as a metallic strip from a banknote (a twenty euro note) passes by. It should be appreciated that FIG. 6 does not relate to the same orientation of channel detectors 120 as is shown in FIGS. 3 and 4. In contrast to FIGS. 3 and 4, FIG. 6 relates to a single channel detector 120 located above a metallic strip extending across the width of a banknote, as the banknote is moved long edge first (in contrast to the short edge first transport of FIG. 2) past the single channel detector 120.

In FIG. 6, a negative voltage transition leading to a negative voltage trough indicates that a south pole magnet has been detected (indicated by an "L" beneath the x-axis); a positive voltage transition leading to a positive voltage trough indicates that a north pole magnet has been detected (indicated by an "H" beneath the x-axis); and a transition towards zero, but with no trough, indicates the absence of a magnet (indicated by an "N" beneath the x-axis).

Figure 7:
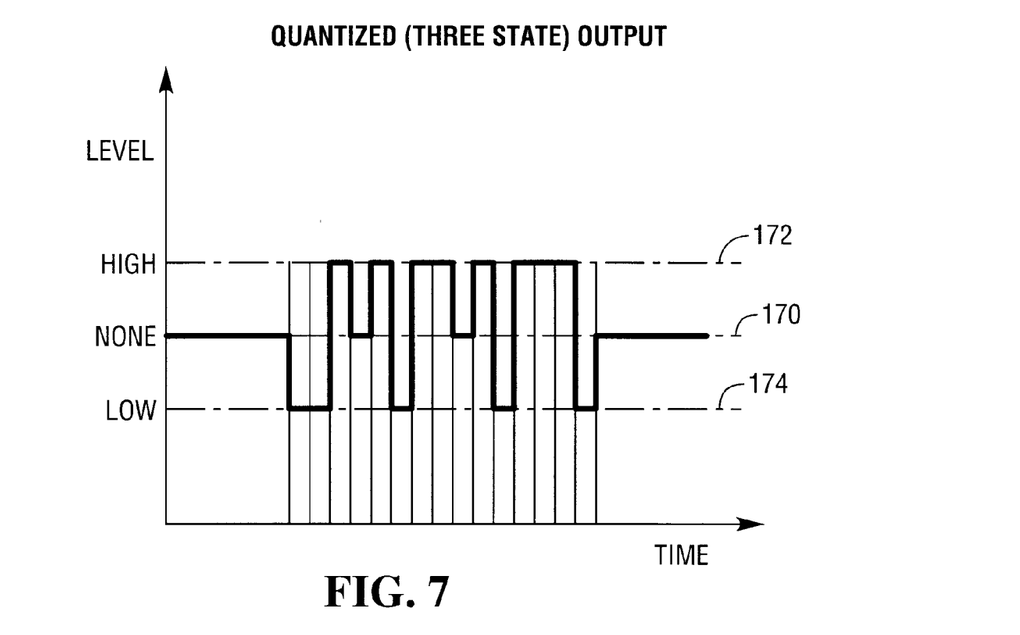
FIG. 7 illustrates a quantised output of the graph of FIG. 6.

Reference will also be made to FIG. 7, which is a graph illustrating the analogue output of the channel detector quantized by the microcontroller 140 into one of three outputs representing: no magnet present; north pole magnet present; or south pole magnet present.

The state of no magnet present is self-explanatory and is illustrated by line 170 in FIG. 7.

If a north pole magnet is present, then this indicates that there is a high coercivity magnet present, or at least a magnet with a coercivity higher than the magnetic field strength applied by the second permanent magnet 86. This is because the second permanent magnet 86 was not able to reorient the magnetic field of the magnet that was detected. This high state is illustrated by line 172 in FIG. 7.

If a south pole magnet is present, then this indicates that there is a low coercivity magnet present, or at least a magnet with a coercivity lower than the magnetic field strength applied by the second permanent magnet 86. This is because the second permanent magnet 86 was able to reorient the magnetic field of the magnet that was detected. This low state is illustrated by line 174 in FIG. 7.

It will therefore be appreciated that by using these three states it is possible to ascertain if a line across a banknote contains any magnetic features, and if so, whether these features have high coercivity or low coercivity.

The microcontroller 140 may create a magnetic map of an entire bank note by buffering the outputs from thirty-two pairs of individual channel detectors 120 until the entire banknote 16 has passed between the two sensing boards 90*a,b*. This magnetic map (or magnetic template) may then be transferred to the validation controller 70, where is can be processed for comparison with stored magnetic maps of genuine banknotes. Any convenient 2D correlation technique may be used. The stored magnetic maps may be referred to as magnetic templates.

It will now be appreciated that this embodiment has the advantage that an inexpensive sensor can be used to detect the presence of a magnet and also whether the magnet has high coercivity or low coercivity.

Various modifications may be made to the above described embodiment within the scope of the invention, for example, in other embodiments, media items other than banknotes may be validated, such as cheques, tickets, and the like.

In other embodiments, the depository may be operable to receive and process cheques and/or banknotes, including a bunch of both cheques and banknotes.

In other embodiments, electromagnets may be used instead of permanent magnets for the first and second magnetic field generators.

In other embodiments, the first magnets may have their south poles towards the banknote and the second magnets may have their north poles towards the banknote.

The strength of the magnets used may be higher or lower than the values described above. The strength of the magnets used should be related to the coercivity of the magnetic security features to be detected. Where some magnetic security features have a higher coercivity than other magnetic security features on the same media item, the magnetic field strength of the first magnet should be strong enough to re-orient all magnetic security features (both high coercivity and low coercivity); whereas, the magnetic field strength of the second magnet should only be strong enough to re-orient the low coercivity magnetic features.

The steps of the methods described herein may be carried out in any suitable order, or simultaneously where appropriate. The methods described herein may be performed by software in machine readable form on a tangible storage medium or as a propagating signal.

The terms "comprising", "including", "incorporating", and "having" are used herein to recite an open-ended list of one or more elements or steps, not a closed list. When such terms are used, those elements or steps recited in the list are not exclusive of other elements or steps that may be added to the list.

Unless otherwise indicated by the context, the terms "a" and "an" are used herein to denote at least one of the elements, integers, steps, features, operations, or components mentioned thereafter, but do not exclude additional elements, integers, steps, features, operations, or components.

The presence of broadening words and phrases such as "one or more," "at least," "but not limited to" or other similar phrases in some instances does not mean, and should not be construed as meaning, that the narrower case is intended or required in instances where such broadening phrases are not used.

What is claimed is:

1. A magnetic sensor for discriminating between high and low coercivity magnets, the sensor comprising:
   (i) a first magnetic field operable to orient high and low coercivity magnets in a first magnetic orientation;
   (ii) a second magnetic field, lower in strength than the first magnetic field, and operable to orient only the low coercivity magnets in a second magnetic orientation opposite to the first magnetic orientation; and
   (iii) a sensor for ascertaining the magnetic orientation of each of the magnets and thereby identifying if a magnet is a high coercivity magnet or a low coercivity magnet and the sensor including a microcontroller for outputting an indication of a magnetic field strength for the magnet and a polarity for the magnet, wherein the sensor further includes pairs of channel detectors, each pair configured to provide a pair of sensing outputs simultaneously to the microcontroller, each pair of sensing outputs includes one positive signal and one negative signal for electrical currents in an analogue format, the microcontroller configured to convert the positive and negative signals to a digital format and subtract the positive and negative signals in the digital format from one another to reduce noise and output a result from the subtraction as the indication in the digital format.

2. A magnetic sensor according to claim wherein the sensor for ascertaining the magnetic orientation of each of the magnets comprises a fluxgate sensor.

3. A magnetic sensor according to claim 2, wherein the fluxgate sensor comprises a printed circuit board (pcb) having a plurality of track layers.

4. A magnetic sensor according to claim 3, wherein the pcb also defines a plurality of vias extending therethrough, and a plurality of tracks, each track spiraling around a via to provide a coil.

5. A magnetic according to claim 4, wherein the fluxgate sensor also comprises a plurality of microwires, each microwire located in a via and oriented normal to pcb track layers.

6. A magnetic sensor according to claim 5, wherein the microwires comprise glass coated bistable microwires.

7. A magnetic sensor according to claim 6, wherein the fluxgate sensor comprises a linear array of vias, adjacent vias being spaced by a fixed distance.

8. A magnetic sensor according to claim 2, wherein the magnetic sensor further comprises (iv) a second fluxgate sensor spaced from and aligned with the first fluxgate sensor to define a gap between the two fluxgate sensors through which media items may be moved.

9. A method of discriminating between high and low coercivity magnets, the method comprising:
   using a first magnetic field to orient high and low coercivity magnets in a first magnetic orientation;
   using a second magnetic field, lower in strength than the first magnetic field, to orient only the low coercivity magnets in a second magnetic orientation opposite to the first magnetic orientation;
   ascertaining the magnetic orientation of each of the magnets;
   outputting a magnetic field strength for the magnet and a polarity for the magnet, herein outputting further includes sensing pairs of outputs simultaneously, each pair of sensing outputs includes one positive signal and one negative signal for electrical currents in an analogue format, converting the positive and negative signals to a digital format and subtracting the positive and negative signals in the digital format from one another to reduce noise and outputting a result from the subtracting as the indication in the digital format; and
   identifying if a magnet is a high coercivity magnet or a low coercivity magnet based on the ascertained magnetic orientation.

* * * * *